United States Patent [19]

Brown, Jr. et al.

[11] 4,115,763

[45] Sep. 19, 1978

[54] ELECTRICAL SWITCHING SYSTEM

[75] Inventors: Arling Dix Brown, Jr., Cleveland Hts.; Edward Justus Reilly, Mayfield Hts., both of Ohio

[73] Assignee: Gould Inc., Rolling Meadows, Ill.

[21] Appl. No.: 758,102

[22] Filed: Jan. 10, 1977

Related U.S. Application Data

[62] Division of Ser. No. 671,427, Mar. 29, 1976, Pat. No. 4,058,814.

[51] Int. Cl.[2] ........................ G01D 15/06; G11C 5/02; G11C 11/36

[52] U.S. Cl. ................................ 340/166 R; 307/281; 346/154

[58] Field of Search .................... 340/166 R; 346/154, 346/153; 307/246, 259, 280, 281, 294, 319

[56] References Cited

U.S. PATENT DOCUMENTS

| | | | |
|---|---|---|---|
| 3,134,028 | 5/1964 | Jensen | 307/281 |
| 3,244,903 | 4/1966 | Sear | 307/281 |
| 3,250,922 | 5/1966 | Parham | 307/281 |
| 3,280,344 | 10/1966 | Ville | 307/281 |
| 3,385,982 | 5/1968 | Raillard et al. | 307/319 |
| 3,493,931 | 2/1970 | Foglia | 307/259 |
| 3,689,912 | 9/1972 | Dick | 307/281 |
| 3,701,119 | 10/1972 | Waaben et al. | 307/281 |
| 3,719,832 | 3/1973 | Waaben | 307/319 |
| 3,732,573 | 5/1973 | Merka et al. | 346/154 |
| 3,946,403 | 3/1976 | Ikeuchi et al. | 346/154 |

*Primary Examiner*—Donald J. Yusko
*Attorney, Agent, or Firm*—David B. Deioma; Thomas E. Kocovsky; Charles E. Snee, III

[57] ABSTRACT

An electrographic writing system including an electrographic writing head operatively connected to a switching system is disclosed. The electrographic writing head includes a plurality of electrically conducting styluses arranged to produce an electrostatic charge on a record medium which is normally dielectric coated paper. The styluses are supported by an insulating material, and one of the ends of each of the styluses is either substantially flush with one end of the writing head or slightly recessed. The other ends of the styluses act as part of a connecting means to the switching system. The switching system includes a plurality of diode assemblies. Each diode assembly has a sequence of diode switching circuits including a first high stored charge or slow diode, a second low stored charge or fast diode in series therewith and a capacitor. The capacitor has one end connected between the diodes and the other end to ground or a dynamic voltage. A stylus is connected to each capacitor and a transistor setup switch is operatively connected to a plurality of diode switching circuits, including one from each of the diode assemblies. Electrical drive means, i.e. a voltage source, is operatively connected to and controls the input to the diode assemblies. A positive bias and a clamping diode may be used with the transistor setup switch to prevent damage thereto and prevent the stylus from going positive under certain conditions.

10 Claims, 8 Drawing Figures

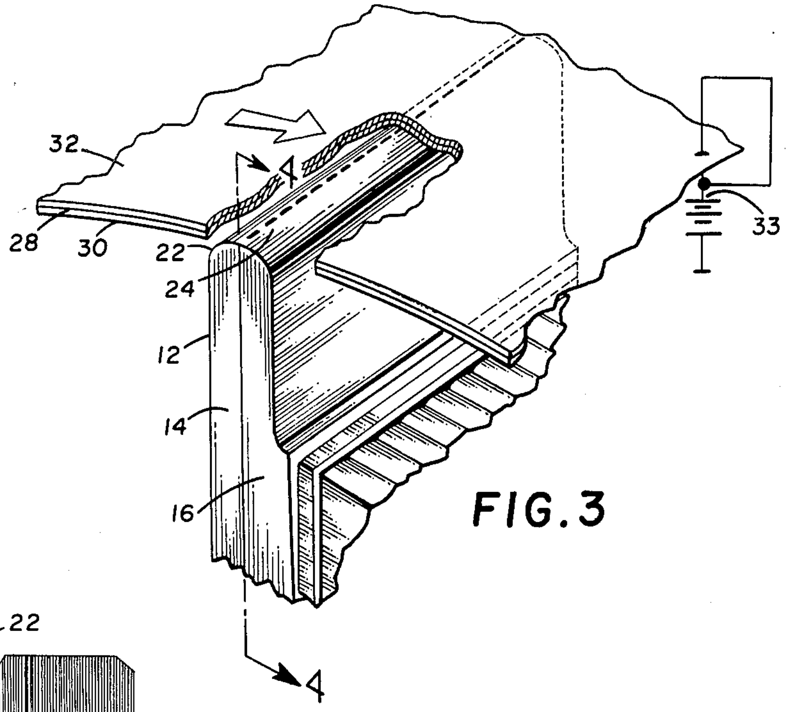
FIG. 3
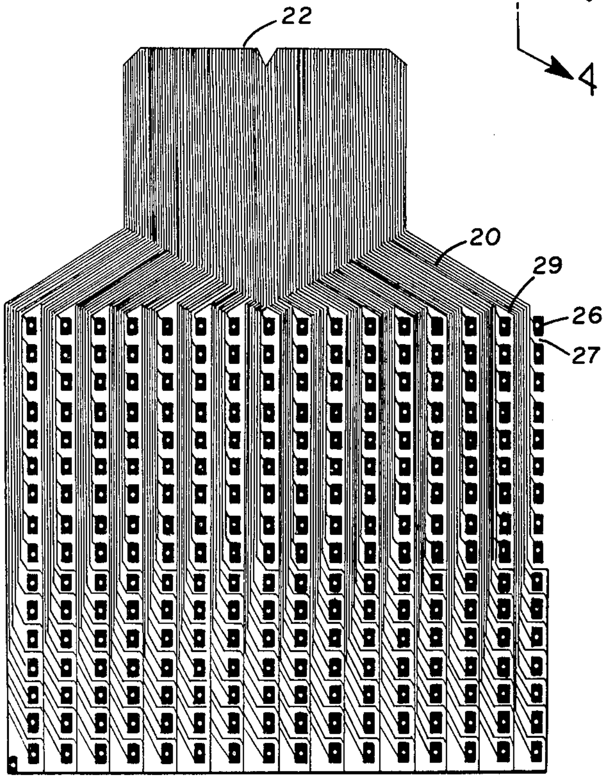
FIG. 4
FIG. 5
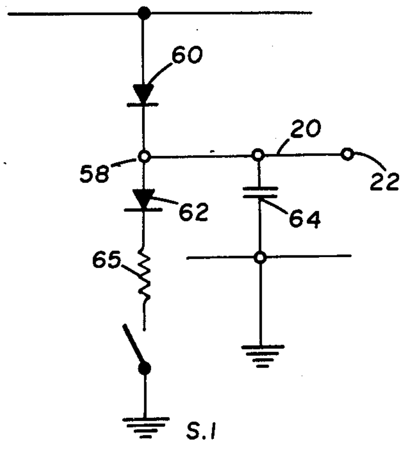

ELECTRICAL SWITCHING SYSTEM

This Application is a division of application Ser. No. 671,427, filed Mar. 29, 1976 now U.S. Pat. No. 4,058,814.

BACKGROUND OF THE INVENTION

1. Field of the Invention

This invention relates to electrographic recording systems. Voltages are impressed on record electrodes or styluses as desired and an electrographic record medium in the proximity of the electrodes is electrostatically charged to form a latent image. Toner is subsequently applied to the record medium to develop the image. The improvement described herein relates to circuitry for impressing a voltage on the record electrodes.

2. Description of the Prior Art

An electrographic writing system may have thousands of styluses which must have a voltage impressed thereon quickly, efficiently and economically. Many different types of electrographic recording systems have been devised. For example, U.S. Pat. No. 3,662,396, incorporated by reference, discloses an electrographic recording system of the type utilizing coated paper as the record medium. A first array of recording electrodes is mounted in close proximity to the exposed surface of the charge retentive layer of the record medium. A second array of complementary electrodes is mounted adjacent to the first array in cooperative relationship with the record medium. A circuit is used to apply a first voltage of one polarity to the first array and second voltage of the opposite polarity to the second array of complementary electrodes. The second voltage thereby causes the potential of the conductive layer to change in coincidence with the first voltage.

Another type of prior art device is shown in U.S. Pat. No. 2,919,171 to Epstein and Phelps. That patent shows a record medium threaded between a recording electrode and a complementary electrode or backing bar. The record medium is moved in contact with the backing bar but not the recording electrode. A coincident voltage type of electrographic recording is utilized to charge the record medium. That is, a signal information voltage is placed on the recording electrode and a voltage of opposite polarity is placed on the backing bar. Neither voltage alone is sufficient to charge the record medium. But, when both charges are supplied simultaneously, the resultant charge is sufficient to place a latent image on the record medium.

Both of these dual electrode systems have a relatively short write time. A single electrode system is desirable to increase the time available for writing, reduce size, complexity and cost. Individual electrical drives for each stylus would impress voltages on the styluses quickly, but are economically unfeasible for the large number of styluses involved. Prior art devices have also suggested the use of a plurality of high voltage switching transistors for each stylus. The quality and expense demanded by a plurality of switching transistors for each stylus also makes this possibility undesirable.

This invention, by the use of diodes in an array, provides a switching system for an electrographic recording head which is fast, safe, compact, economical and reliable. The use of an array of diodes eliminates much of the circuitry and wiring previously thought necessary as well as a complementary charging means. Diodes and, particularly, high stored charge diodes also known as slow diodes are less costly than high voltage switching transistors and electrical drives. The use of the diode switching circuits permits relatively long writing times and the use of a wide range of record mediums. This latter feature is a distinct advantage. Previous systems often required an expensive and difficult to manufacture coated paper having a low resistance in the order of 0.25 to 1.0 megohm per square. This invention permits the utilization of a record medium having a resistance up to about 100 megohms per square. This high resistance medium is relatively easy to manufacture and inexpensive.

Increased safety to the unit itself and to any operator over previous devices is also an advantage of this invention. Prior art units used relatively high energy devices and, as a result, encountered arcing between conductors. The high voltages and currents also presented a danger to operators. This invention by the use of the diode reverse current permits the use of lower energies while still obtaining the necessary voltage to electrostatically create an image. The lower energy level significantly reduces the possibility of arcing and the danger to operators.

The diode array of this invention is usable as a switching system with the above-noted advantages because of a relatively unused phenomenon of the diode. This characteristic is the reverse current that is experienced for an appreciable time after a high stored charge diode is switched from a forward to a reverse voltage. The reverse current is used with a storage means to hold a writing stylus at a desired voltage in a system capable of charging a record medium.

SUMMARY OF THE INVENTION

An electrostatic recording system for writing on a record medium having a charge-retentive surface and a conductive layer. An electrographic writing head includes a plurality of styluses operatively connected to a switching system which includes at least one high stored charge diode for each stylus. A control switch is operatively connected to the high stored charge diode and permits the switching system to apply voltages to the styluses.

BRIEF DESCRIPTION OF THE DRAWINGS

FIG. 3 is a schematic representation of an electrographic record medium partially cut away passing over the record head;

FIG. 4 is a section 4—4 taken through FIG. 3;

FIG. 5 is a circuit diagram of the switching circuit;

DETAILED DESCRIPTION OF THE DRAWINGS

For a better understanding of the present invention, together with other and further objects thereof, reference is had to the following description taken in connection with the accompanying drawings, and its scope will be pointed out in the appended claims.

Electrographic Writing Head

Figure 1:
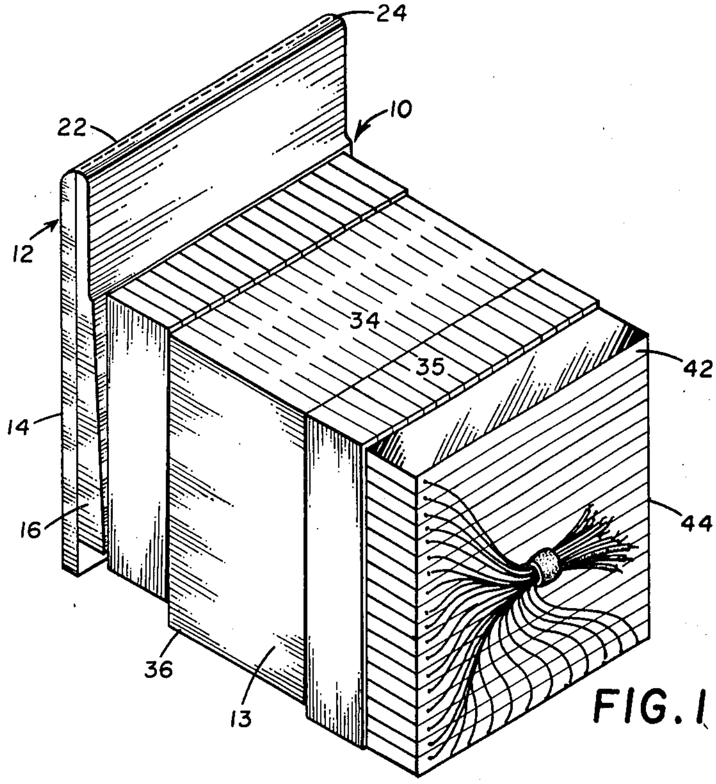
FIG. 1 is a perspective representation of the electrographic writing system of this invention.

As illustrated in FIGS. 1, 3 and 4, the electrographic writing system 10 of this invention includes a writing head 12 and a switching system 13. Although dimensions may vary, the writing head 12 has a height of about 3 inches and a thickness of about ¼ inch. A first section 14 and a second section 16 of the writing head 12 is made of a dielectric material, such as epoxy. The first section 14 and second section 16 sandwich a group of styluses 20 which are basically electrical conductors having one of their ends 22 substantially adjacent to the top 24 of the head 12. The top 24 is rounded to facilitate passing paper over it.

The dimensions of the recording styluses 20 may vary but are about 0.5 mil thick and 2 mil long and are separated by about 2 mil. Thus, the styluses have about a 4 mil center-to-center spacing. The exposed ends 22 of the styluses may be recessed about 0.05 to 0.4 mils so that they are spaced slightly from the record medium. It is also possible to alternately have the ends 22 of the styluses flush with the end surface 24 of the head 12 and obtain effective spacing by utilizing the device shown in U.S. Pat. No. 3,657,005, the content of which is incorporated by reference. As shown in that disclosure, small spacing particles are attached to or embedded in the dielectric layer of the record medium to provide the desired spacing.

As shown in FIG. 4, the other end of the styluses 20 are cylindrical female connectors 26 which are part of a connecting means. The male members are connected to the switching system 13 but are not illustrated. It is anticipated that other connecting means may be used. It is only necessary that the styluses are operatively connected to the switching system and are properly spaced relative to the driving voltage to prevent arcing.

FIG. 4 shows a 16 × 16 array of female connecting members 26, but it is fully anticipated that much larger arrays can and will be utilized and this description should not restrict interpretation of this invention. The arrangement of the 16 × 16 array is used to minimize the size of the electrographic head and to facilitate the connection with a switching system. The longitudinal spacing 27 is slightly different than the spacing 29 along the width. The utilization of the male and female type connecting member permits connection and separation of the styluses to the switching system by simply pressing the members together and pulling them apart.

As particularly shown in FIG. 3, the writing head 12 acts in conjunction with an electrographic record medium 28 which includes a dielectric layer 30 nearest the head and a conductive layer 32. Suitable thicknesses for the dielectric layer are about 0.1 to 0.25 mil. The sheet resistances of the conductive portions may range from about 0.25 to 100 megohm per square. This very large range of useful record mediums is highly desirable. As noted earlier, high resistance record medium (above 10 megohm per square) is commercially available, less critical and less expensive than low resistance mediums (below a few megohms per square).

A voltage supply 33, shown diagrammatically in FIG. 3 may be utilized to maintain the record medium at a voltage opposite to the voltage of the styluses during writing. The total absolute voltage differential between the record medium 28 and the styluses 20 is thus increased to facilitate writing. In practice, a total voltage differential of about 600 volts is used to create a latent image on the record medium. If +250 volts are maintained on the record medium 28, only −350 volts are needed to write. Satisfactory results can be obtained by utilizing this method, but the medium 28 has to be brought to ground potential before toner is applied.

An alternate method of raising the total potential between the record medium 28 and the styluses 20 during writing is to maintain the medium 28 at ground and bias the styluses and associated circuits to a −250 volts in addition to the writing voltage applied thereto.

Switching System

As noted above, an electrographic writing system must have a switch for each stylus. In the prototype embodiment shown in FIG. 1, this requires 256 separate switches. If each of these switches is an electrical drive, the cost is prohibitive. If each switch is a switching transistor, the cost is also substantial. This invention utilizes a relatively small number of electrical drives and switching transistors in conjunction with diodes to perform the necessary switching function. The switching system of this invention is unique in concept and design. It utilizes what was previously thought to be an undesirable trait of some diodes, namely, their high stored charge capacity. This high stored charge can produce a significant reverse current during application of a reverse voltage after a forward current to the diode. This invention uses the reverse current to charge a capacitor and put a voltage on the connected stylus in order to place a latent image on the record medium.

Figure 2:
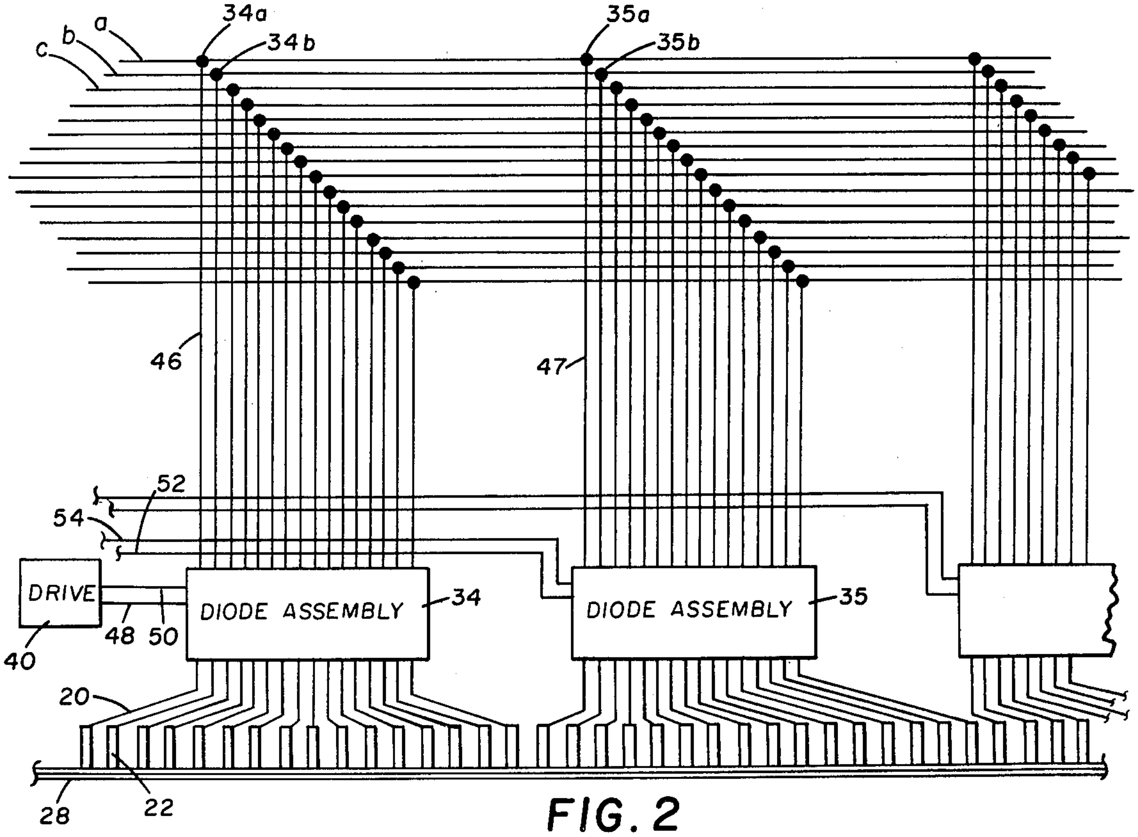
FIG. 2 is a combined wiring and block diagram of the electrographic writing system.

As shown in FIGS. 1 and 2, the switching system 13 includes a plurality, in this case 16, diode assemblies, two of which, by way of example, are numbered 34 and 35. Connecting means 42 are used to connect the diode assemblies through appropriate electrical wiring 44 to an input.

As illustrated in FIG. 2, the diode assembly 34 has 16 styluses 20 operatively connected thereto to form the output of the circuitry. The ends 22 of the styluses 20 are in proximity to the record medium 28. Fifteen other diode assemblies have similar sets of styluses. A series of 16 inputs 46 are connected to the first diode assembly. A similar set of inputs 47 and outputs are connected to the diode assembly 35. Similar circuitry is connected to each of the other diode assemblies. A first input **34*a* of the diode assembly 34 is operatively connected with a first input 35*a* of the diode assembly 35 and is similarly connected to the first input of every other diode assembly. The same type of connection is made with respect to the second inputs to each of the 16 diode assemblies, e.g., 34*b*, 35*b***, etc. Each of the common conductors *a, b, c*, etc., are connected to a means for setting up as will be described more fully below.

The diode assembly 34 has input leads 48 and 50 which are operatively connected to a voltage source or drive means 40 on one terminal and either ground or a positive bias at the other terminal. Similar electrical drive connectors 52 and 54 are provided for the diode assembly 35 as well as the other diode assemblies. Pairs or larger groups of diode assemblies may be connected to a common high voltage source 40 while retaining its function and the versatility of the system. By way of example, if the pair of diode assemblies 34 and 35 were connected to a common voltage source or drive means, only 8 such sources would be required. While 32 setup transistors would be required for this combination, they are less economically significant than drive means. The same type of arrangement could be made with 4 high-voltage sources or drives and 64 setup transistors.

The actual voltage source does not make up part of this invention, but when a suitable drive is fed to a diode assembly and the appropriate switches are on, the styluses will have a high voltage applied to them and they, in turn, can place a latent image on the record medium. That is, the unit writes.

Figure 7:
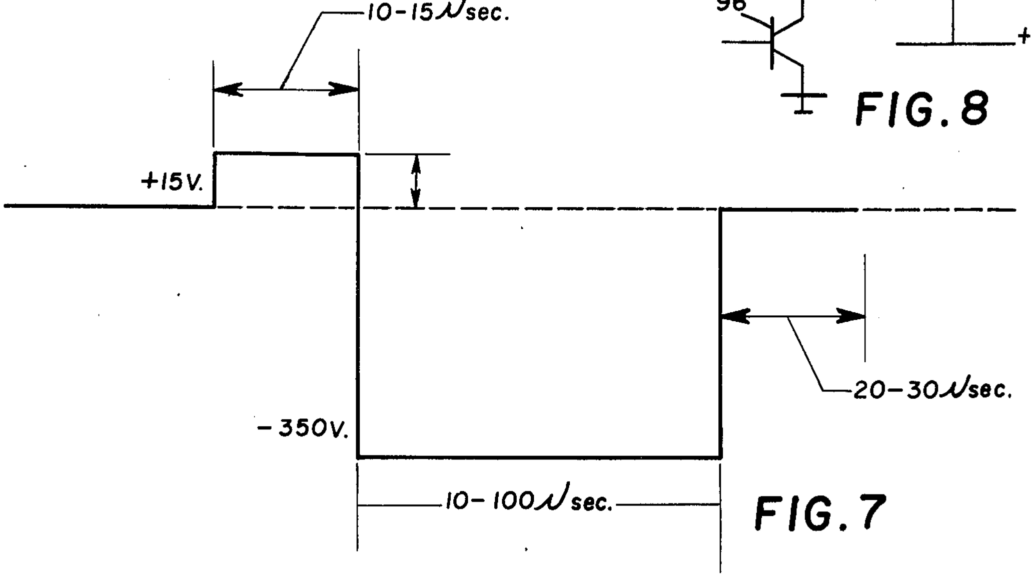
FIG. 7 is a graphical representation of the input voltages applied to the circuitry.

Each diode assembly, such as 34, includes a plurality of diode switching circuits. A simplified diode switching circuit 58 is illustrated in FIG. 5 and includes a first high stored charge or slow diode 60 having a charge of about 50 to 80 nanocoulombs when set up or charged, although it is anticipated that other charges may be used. In practice, a second low stored charge or fast diode 62 is used as part of the means for setting up and has a charge of about 10 nanocoulombs or less when set up. It is desirable that the stored charge difference between diode 60 and 62 is greater than 40 nanocoulombs when set up. A charge storage means includes a capacitor 64 of about 30 pf, which is operatively connected with the diode 60. The capacitor 64 is connected to the stylus 20, and has one end going to ground or a bias. A resistor 65, typically about 1.5 K ohm, is connected to the second diode. In practice, a small setup voltage (see FIG. 7) of about 15 volts is impressed upon the input across the diode 60 and the capacitor 64 and causes a current of about 10 milliamps to flow through diodes 60 and 62. The setup time is about 10 to 25 microseconds, although other time periods may be utilized. Subsequently, a large negative voltage of about $-350$ to $-500$ volts is impressed across the input. If switch S-1 is closed, a reverse current is experienced through diode 60 in the order of about 10 milliamps. As a result of the difference in stored charge of the diodes, about 40 nanocoulombs of charge is available to bring the stylus 20 to about $-350$ volts and hold it there by means of the stored charge of the capacitor 64. The stylus 20 is held at the negative voltage for a writing time sufficient to impress a latent image on the record medium 28. The only limitations on the writing time is the leakage capacity of the circuit, but such time is in excess of the time necessary for writing. In practice, the writing time is normally in the area of 10 to 1,000 microseconds while the leakage produces a change of only about 25 volts per 1,000 microseconds. After writing, the drive may return the stylus to ground voltage for a recovery time of 20 to 30 microseconds or, alternately, go directly to the next setup voltage.

Figure 6:
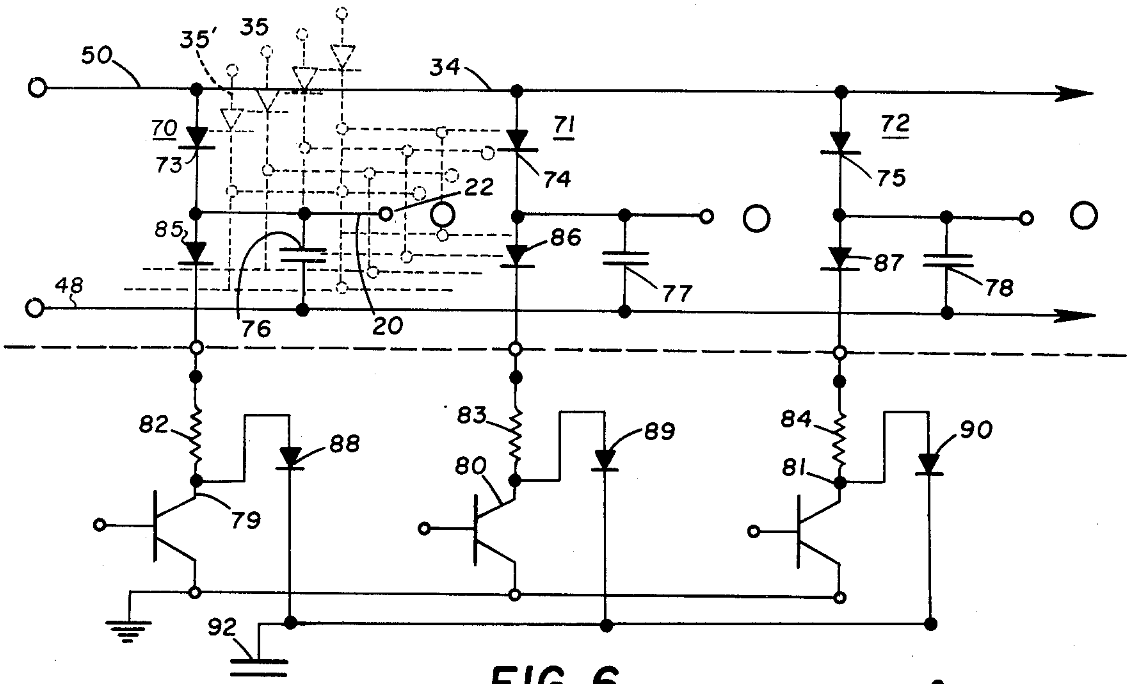
FIG. 6 is a schematic diagram of a partial diode switch assembly.

FIG. 6 illustrates an array of the diode assemblies 34, 35 and others as they may actually be utilized as well as a means for setting up the voltage conditions on the styluses. The diode assembly 34, by way of example, has a plurality of parallel connected diode switching circuits 70, 71 and 72. First high stored charge capacity diodes 73, 74 and 75 and series capacitors 76, 77 and 78, respectively, are included in the diode switching circuits 70, 71 and 72, respectively. A series of styluses 20 having ends 22 are connected to each capacitor.

The means for setting up includes a series of setup switching transistors, e.g., 79, 80 and 81 with series 1.5 K ohm resistors 82, 83 and 84, respectively. Each set of switching transistors is connected across similarly positioned diode switching circuits for each of the diode assemblies. For example, transistor switch 79 is connected to the first diode switching circuit 70 in the diode assembly 34 and a first diode switching circuit 35' in the diode assembly 35. While a common drive is used for each diode assembly, it should be noted that each of the diode assemblies act in a sequence of about 10 to 20 microseconds each. The use of diode assemblies with their driver ultimately allows writing on the paper at speeds up to about 10 inches per second.

The means for setting up further includes second low stored charge capacity diodes 85, 86 and 87 connected between diodes 73, 74 and 75, respectively, and the resistors 82, 83 and 84, respectively. Diodes 85, 86 and 87 protect the transistor switches 79, 80 and 81, respectively, from large voltages. Clamping diodes 88, 89 and 90 are respectively across transistors 79, 80 and 81 and attached to a positive bias 92. The positive bias 92 of about 15 volts and clamping diodes 88, 89 and 90 protect the transistors 79, 80 and 81 from high voltages and prevent the styluses from going positive under certain conditions.

The premise of the entire system is that when a diode assembly is driven with a power source and the switch is closed, the stylus will be impressed with a voltage and write. In this process, it is equally important that the styluses which do not have their switches closed will not write. However, when the switches 79, 80 and 81 are open, the inherent characteristics of the components cause a negative voltage of about $-75$ volts to appear on the styluses. In order to offset this voltage, a positive voltage is applied through conductor 48 to one side of the capacitors at the same instant that the drive voltage goes to $-350$ volts. The use of a positive voltage, which is normally about 100 volts and slightly greater than the negative voltage experienced, prohibits any negative build up on the stylus 20. The use of the clamping diodes 88, 89 and 90 allows any excess positive voltage from the positive source to be discharged. In this manner, no positive build up is experienced by the styluses having open setup switches.

Figure 8:
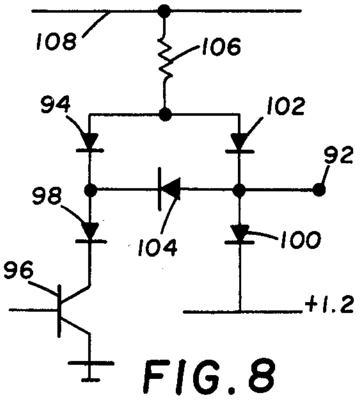
FIG. 8 is an alternate embodiment of the switching circuit.

An alternate circuit utilizing the same concept is shown in FIG. 8. As illustrated therein, a stylus 92 is governed by a high stored charge or slow diode 94 leading to a switching transistor 96 through a low stored charge or fast diode 98. A second slow diode 100 is in series with a fast diode 102. The stylus 92 and a diode 104 are operatively connected between the pairs of fast and slow diodes.

If the transistor switch 96 is open, current simply flows through diodes 102 and 100 to ground. The diode 100 acts as a clamp for the stylus 92 under this condition. If the transistor switch 96 is closed, current may flow through the diodes 94 and 98. When a large reverse voltage is applied to the input following a forward voltage, the stylus 92 is drawn down in voltage. A bias of $+1.2$ volts is established to prevent current in the wrong direction.

Variations and alterations in the circuitry and setup of this invention will be obvious to those skilled in the art and such modifications are anticipated to be within the scope of this invention. For example, if the styluses were spaced further apart, driving voltages in the area of $-600$ volts would be permitted without a bias on the paper or styluses. In this situation, a stylus with an open setup switch would reach a $-150$ volts from the inherent characteristics of the circuit. However, the $-150$ volts would not be sufficient to write and would not need the additional bias devices described above. This invention has been described with negative voltages but would function equally well with a positive voltage by reversing the diodes, changing the type of transistors and reversing the voltages. Moreover, if short writing times were permissible, the capacitor 64 in FIG. 5 could be eliminated and if it were not necessary to protect the transistor switches, the circuit could also operate without the low stored charge diodes.

The invention claimed is:

1. A switching system comprising:

a first diode circuit having a first high stored charge diode;

switch means in series with said first high stored charged diode;

means for impressing a forward voltage across said high stored charge diode and said switch means whereby when said switch means is closed and said forward voltage is impressed, a current flows through said high stored charge diode;

an output connected to the cathode of said first high stored charge diode; and means for impressing a reverse voltage across said first high stored charge diode, whereby when said switch means is closed and said reverse voltage is impressed, a reverse output voltage of greater magnitude than the forward voltage across the high stored charge diode and the switch means is caused on said output.

2. The switching system of claim 1, further including a low stored charge diode having its anode operatively connected to the cathode of the high stored charge diode, and the first diode circuit further includes a capacitor operatively connected to the output.

3. The switching system of claim 2 which further includes a plurality of switching circuits arranged in parallel to form at least one diode assembly.

4. The switching system of claim 3 wherein the high stored charge diode has a charge of about 50–80 nanocoulombs after set up.

5. The switching system of claim 4 wherein the low stored charge diode has a charge less than 10 nanocoulombs after set up.

6. The switching system of claim 3 wherein the high stored charge diode has a stored charge of at least 40 nanocoulombs more than the low stored charge diode after setup.

7. The switching system of claim 2 wherein said switch means is a transistor.

8. A switching system for controlling a high voltage output with a low voltage switching element comprising:

a first electrical contact point;

a high stored charge diode with its anode connected to said first electrical contact point and its cathode connected to a first junction point;

an output connected to said first junction point;

a low stored charge diode having its anode connected to said first junction point and its cathode connected to a low voltage switching means;

said low voltage switching means connected between said low stored charge diode cathode and a second electrical contact point; and voltage impressing means for first impressing a small positive voltage on said first electrical contact point relative to said second contact point whereby if said switching means is closed a small electrical current is caused to flow from said first electrical contact point through said high stored charge diode and said low stored charge diode and through said low voltage switching means to said second contact point and for second impressing a large negative voltage on said first electrical contact point relative to said second contact point whereby, if said switch means is closed, a large negative voltage is caused on said output.

9. The switching system of claim 8 further including:

a diode means connecting said output to said first junction point with its cathode connected to said first junction point and its anode connected to a second junction point whereby the output is connected to the second junction point which is connected to said first junction point by said diode means;

a second fast rectifier diode with its anode connected to said first electrical contact point and its cathode connected to said second junction point; and a second slow rectifier diode with its anode connected to said second junction point and its cathode connected to a small biasing voltage.

10. The switching system of claim 8 wherein said small positive impressed voltage is about +15 volts, said large negative impressed voltage is about −350 to −500 volts and said large negative output voltage is about −350 volts.

* * * * *